US008901665B2

(12) United States Patent
Kelly et al.

(10) Patent No.: US 8,901,665 B2
(45) Date of Patent: Dec. 2, 2014

(54) GATE STRUCTURE FOR SEMICONDUCTOR DEVICE

(75) Inventors: Andrew Joseph Kelly, Hengshan Township, Hsinchu County (TW); Pei-Shan Chien, Keelung (TW); Yung-Ta Li, Kaohsiung (TW); Chan Syun Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 266 days.

(21) Appl. No.: 13/335,431

(22) Filed: Dec. 22, 2011

(65) Prior Publication Data
US 2013/0161762 A1 Jun. 27, 2013

(51) Int. Cl.
*H01L 29/772* (2006.01)
*H01L 21/336* (2006.01)

(52) U.S. Cl.
USPC ........... 257/369; 257/288; 257/329; 257/401; 257/E21.09; 257/E21.19; 257/E21.444; 257/E21.621; 257/E27.062; 257/E29.135; 438/142; 438/287; 438/300; 438/303; 438/306

(58) Field of Classification Search
USPC ................... 257/288, 329, 369, 401, E21.09, 257/E21.19, E21.444, E21.621, E27.062, 257/E29.135; 438/142, 287, 300, 303, 306
See application file for complete search history.

(56) References Cited

U.S. PATENT DOCUMENTS

| 6,348,385 | B1 * | 2/2002 | Cha et al. | 438/287 |
| 6,673,683 | B1 * | 1/2004 | Sheu et al. | 438/287 |
| 6,762,105 | B2 * | 7/2004 | Park | 438/305 |
| 6,875,667 | B2 | 4/2005 | Iizuka et al. | |
| 2005/0020020 | A1 * | 1/2005 | Collaert et al. | 438/300 |
| 2005/0050215 | A1 | 3/2005 | Lin et al. | |
| 2006/0189043 | A1 * | 8/2006 | Schulz | 438/142 |
| 2011/0183485 | A1 * | 7/2011 | Tateshita | 438/294 |
| 2012/0104509 | A1 * | 5/2012 | Matsumoto | 257/369 |
| 2013/0280899 | A1 * | 10/2013 | Chen et al. | 438/586 |

* cited by examiner

*Primary Examiner* — Dao H Nguyen
(74) *Attorney, Agent, or Firm* — Haynes and Boone, LLP

(57) ABSTRACT

The present disclosure provides a method of semiconductor fabrication including forming an inter-layer dielectric (ILD) layer on a semiconductor substrate. The ILD layer has an opening defined by sidewalls of the ILD layer. A spacer element is formed on the sidewalls of the ILD layer. A gate structure is formed in the opening adjacent the spacer element. In an embodiment, the sidewall spacer also for a decrease in the dimensions (e.g., length) of the gate structure formed in the opening.

16 Claims, 7 Drawing Sheets

GATE STRUCTURE FOR SEMICONDUCTOR DEVICE

BACKGROUND

The integrated circuit (IC) industry has experienced rapid growth. In the course of IC evolution, the functional density has generally increased while feature size has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

In order to continually meet performance requirements, there has been a desire to replace some of the polysilicon gate electrodes of an integrated circuit with metal gate electrodes. One process of implementing metal gates is termed a "gate last" or "replacement gate" methodology. In such a process, a dummy (e.g., sacrificial) polysilicon gate is initially formed, various processes associated with the semiconductor device are performed, and the dummy gate is subsequently removed and replaced with a metal gate.

As feature size decreased, it may also be desired to provide shorter effective gate length of a field effect transistor (FET). The shorter gate length may increase the speed of the transistor. However, due to photolithography limitations, providing a shorter gate length for a smaller dimension feature sizes may be difficult to obtain. The characteristics and performance of semiconductor devices can be altered by changing the sizes (e.g., length) of the FETs used. For example, it may be desired to decrease the effective gate length of a device to increase the speed, decrease the current, and/or alter other parameters of the FET.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-7 illustrate cross-sectional views of an embodiment of a semiconductor device 200 at various stages of fabrication according to the method of FIG. 1.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
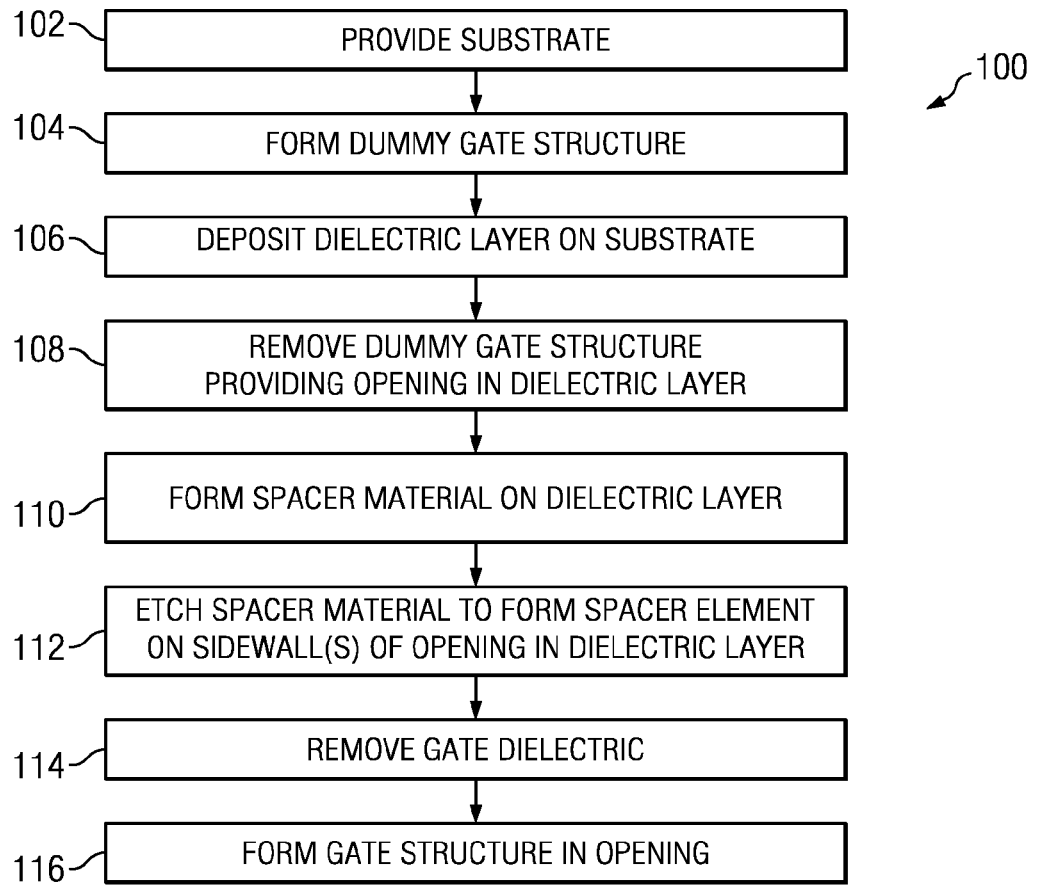
FIG. 1 is a flow chart illustrating an embodiment of a method of fabricating a semiconductor device.

Illustrated in FIG. 1 is flow chart of a method 100 of semiconductor fabrication according to one or more aspects of the present disclosure. The method 100 may be implemented to decrease the effective gate length of a gate of a field effect transistor (FET). In an embodiment, the method 100 may be implemented to decrease the effective gate length of a multi-gate fin-type transistor or finFET device. In an embodiment, the method 100 may be implemented to decrease the effective gate length of planar transistor. However, one may recognize other device types that may benefit from the present method. FIGS. 2-7 are cross-sectional views (FIG. 5c being a representative perspective view) of an embodiment of a semiconductor device 200 fabricated according to the method 100 of FIG. 1. It should be understood that FIGS. 2-7 and the device 200 are representative only and not intended to be limiting.

It should be further understood that the method 100 includes steps having features of a complementary metal-oxide-semiconductor (CMOS) technology process flow and thus, are only described briefly herein. Additional steps may be performed before, after and/or during the method 100. Similarly, one may recognize other portions of a device (e.g., other than a gate structure) that may benefit from the methods described herein. Similarly, though the exemplary devices below are illustrated as modifying an effective gate length, another aspect of the gate structure or feature of a FET may be similarly modified, as but one example, gate width.

It is also understood that parts of the semiconductor device 200 may be fabricated by CMOS technology and thus, some processes are only described briefly herein. Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 may include a plurality of devices interconnected.

The method 100 begins at block 102 where a substrate is provided. The substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate is a semiconductor on insulator (SOI). In other alternatives, semiconductor substrate may include a doped epi layer, a gradient semiconductor layer, and/or a semiconductor layer overlying another semiconductor layer of a different type, such as a silicon layer on a silicon germanium layer. The substrate may include doped regions, such as p-wells and n-wells.

The semiconductor substrate may include isolation structures formed on the substrate for isolating the regions of the substrate. The isolation structures may be formed of silicon oxide, silicon nitride, silicon oxynitride, fluoride-doped silicate glass (FSG), a low-k dielectric material, and/or other suitable insulating material. The isolation structures may be shallow trench isolation (STI) features, local oxidation (e.g., LOCOS), and/or other suitable isolation structures. In an embodiment, the isolation structures are STI features and are formed by etching trenches in the substrate. The trenches may then be filled with isolating material, followed by a chemical mechanical polish (CMP).

In an embodiment, raised elements also known as fins may be formed between isolation (e.g., STI) features. The fins may provide an active region where one or more devices are formed. In an embodiment, a channel of a transistor device is formed in the fin. The associated transistor may be a finFET device. The fin may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The fins may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form a fin on a substrate may be suitable.

In an embodiment, the fins are approximately 10 nanometer (nm) wide and between approximately 10 nm and 60 nm high. However, it should be understood that other dimensions may be used for the fins. In an embodiment, the fins comprise silicon. The fins may be doped using n-type and/or p-type dopants. The fins, and/or the layers used to pattern the fins or adjacent STI regions, may have been subject to one or more trimming processes as known in the art.

Figure 2A:
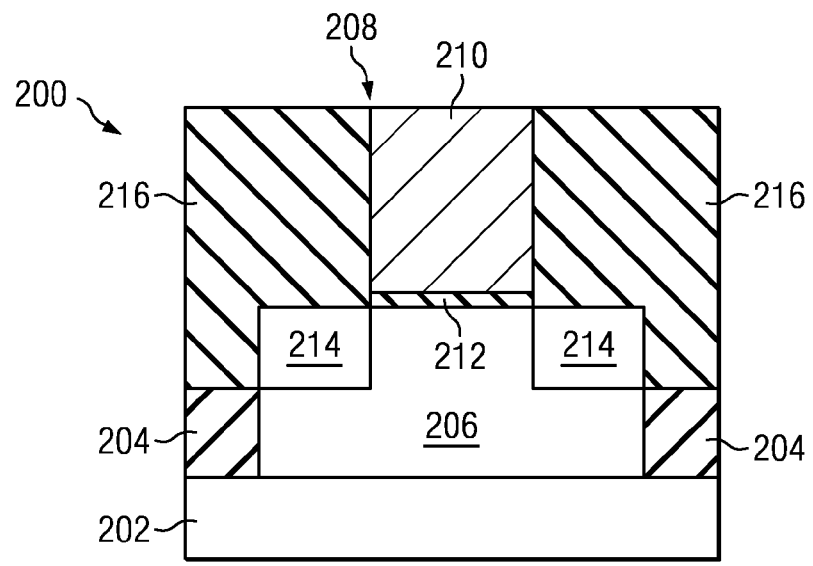
FIGS. 2a, 3a, 4a, 5a, 6a, and 7a provide an x-axis or x-cut view of the device 200.
Figure 2B:
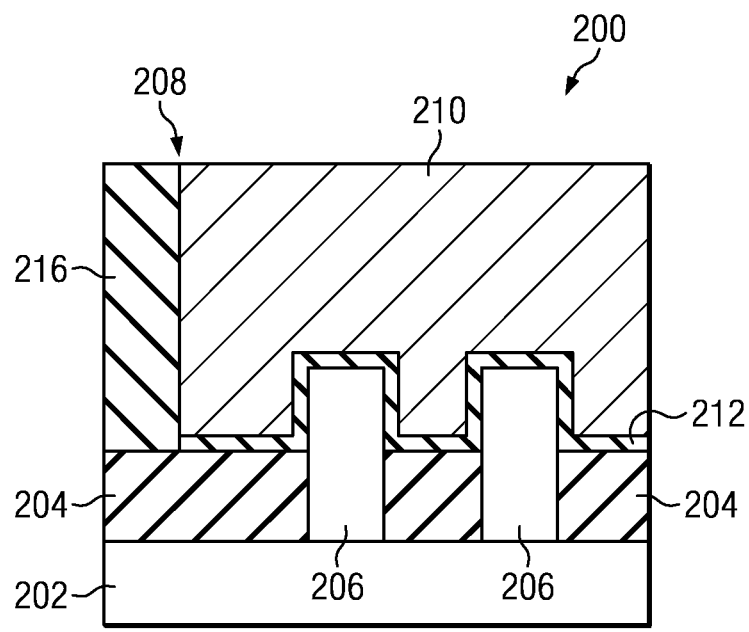
FIGS. 2b, 3b, 4b, 5b, 6b, and 7b provide a y-axis or y-cut view of the device 200.

Referring to the example of FIGS. 2a and 2b, the semiconductor device 200 is illustrated having a substrate 202. The substrate 202 includes isolation (e.g., STI) regions 204 and a plurality of fins 206 extending from the substrate 202. Though illustrated in the example of device 200 as a finFET device, the method 100 is not limited to any specific device type in its application. For example, the same methodology may be applied to forming a planar-type transistor, for example, during a replacement gate process.

The method 100 then proceeds to block 104 where a dummy gate structure (also referred to as a sacrificial gate structure) is formed on the substrate. In an embodiment, the dummy gate structure is formed on and surrounding the fin structure(s). The dummy gate structure may include a gate dielectric and/or a dummy gate electrode. In an embodiment, the gate dielectric layer is silicon dioxide. The silicon dioxide may be thermally grown oxide. The dummy gate electrode may include polysilicon or amorphous silicon gate electrode, and/or other suitable layers. The gate electrode may be formed by depositing a layer of polysilicon (or amorphous silicon). The layer of poly (or a-Si) may then be patterned and etched into one or more polysilicon gate electrodes.

In an embodiment, a gate dielectric layer is formed on the substrate that is not subsequently removed. This may be possible using an HK-first gate replacement methodology. In such an embodiment, the gate dielectric may be a high-k dielectric material. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods. In other embodiments, the gate dielectric layer formed in block 104 is a sacrificial layer subsequently removed from the substrate as described below with reference to block 114.

Referring again to the example of FIGS. 2a and 2b, a dummy gate structure 208 is disposed on the substrate 202. The dummy gate structure 208 includes a dummy gate electrode 210 and a gate dielectric 212. In the exemplary device 200, the gate dielectric layer 212 is a sacrificial layer; however, as described above, other embodiments are possible.

In still further processing, source/drain regions may also be formed on the substrate after the dummy gate structures are formed. The source/drain regions may be formed processes such as ion implantation (e.g., of a portion of the fin or planar substrate region), thermal diffusion, epitaxial growth, and/or other suitable processes. In embodiments, the source/drain regions include epitaxial regions formed on and/or around the fin. In an embodiment, the source/drain regions are formed on and/or around the ends of the fin. Referring to the example of FIG. 2a, source/drain regions 214 are illustrated.

The method 100 then proceeds to block 106 where a dielectric layer is formed on the substrate. The dielectric layer may be an inter-layer dielectric (ILD) layer. The ILD layer may be formed by chemical vapor deposition (CVD), high density plasma CVD (HDP-CVD), spin-on deposition, physical vapor deposition (PVD or sputtering), or other suitable methods. The ILD layer may include silicon oxide, silicon oxynitride, a low-k material, and/or other suitable dielectric. The ILD layer may be formed on and surrounding the dummy gate structures.

The ILD layer may be conformably deposited on the substrate and a chemical mechanical polish (CMP) process performed to planarize the material. The dummy gate structures, described above with reference to block 104, may serve as a planarization stop for the CMP process. In other words, the CMP process may be stopped at the exposure of the top surface of the dummy gate structure.

Referring to the example of FIGS. 2a and 2b, a dielectric ILD layer 216 is disposed on the substrate 202. The ILD layer 216 as illustrated may be after one or more CMP processes.

The method 100 then proceeds to block 108 where the dummy gate structure is removed. The removal of the dummy gate structure provides an opening the ILD layer. The removal of the dummy (sacrificial) structure provides for openings within which a metal gate will be formed, as is typically performed in a replacement gate process. The dummy gate structure removal may include removing a dummy gate electrode and/or a dummy gate dielectric layer. A dummy gate structure may be removed by an etching solution such as, for example, $NH_4OH$, dilute-HF, and/or other suitable etchant. In an alternative embodiment, the sacrificial gate structure may be removed by a suitable dry etching process. Example etchants include fluorine and/or chlorine based etchants.

In an embodiment, the dummy gate electrode is removed and the gate dielectric (e.g., oxide) remains on the substrate.

Figure 3A:
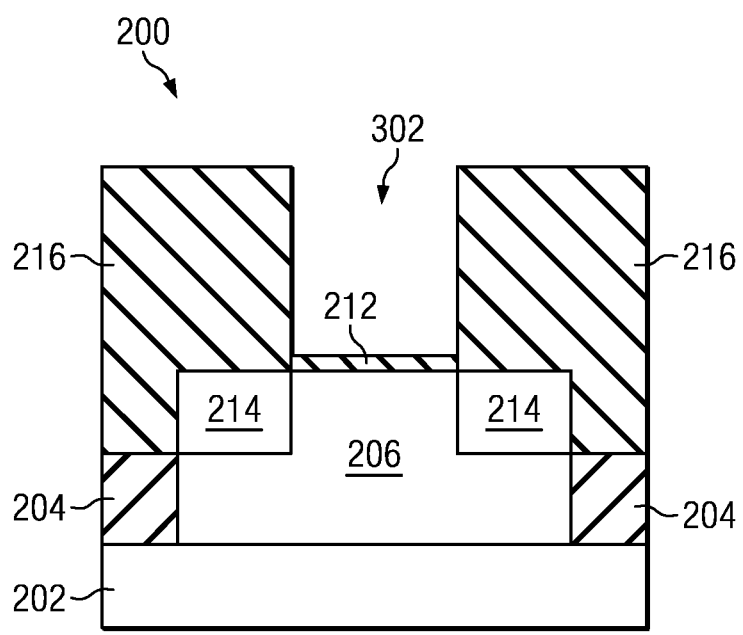
Figure 3B:
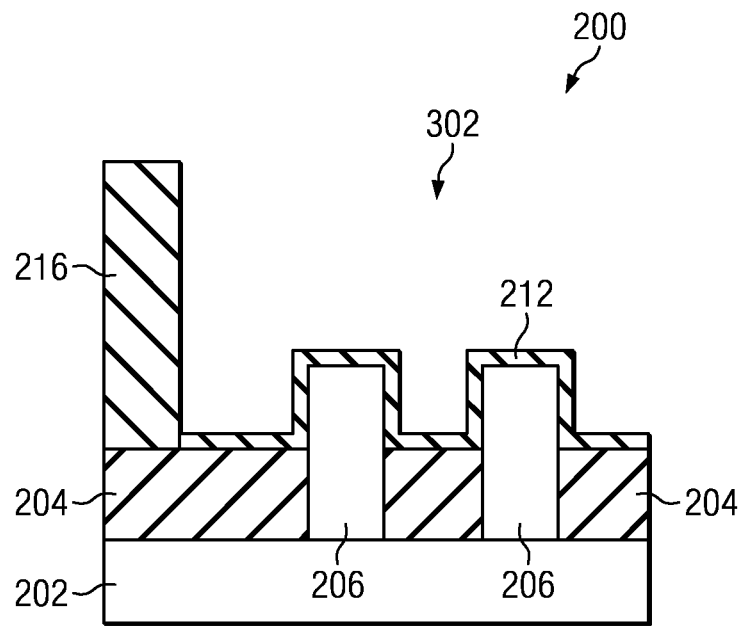

Referring now to the example of FIGS. 3a and 3b, the dummy gate structure 208 (FIGS. 2a and 2b) have been removed and an opening 302 formed. The opening 302 is defined by the sidewalls of the ILD layer 216. The dielectric layer 212 remains on the substrate 202 including on the fins 206.

The method 100 then proceeds to block 110 where a spacer material layer is formed on the substrate. In an embodiment, the spacer material layer may be a conformal layer. The thickness of the spacer material layer may be between approximately 1 nanometer (nm) and approximately 3 nm. In other embodiments, the spacer material layer may be greater than approximately 3 nm in thickness. The thickness of the spacer material layer may serve to define the amount of reduction (or trim) of the effective gate dimensions (e.g., length) of the associated device. For example, the thicker the spacer material layer the greater the decrease in gate dimension (e.g., smaller gate length). The spacer material layer may include silicon nitride, silicon oxide, silicon oxynitride, and/or other suitable dielectric materials.

Figure 4A:
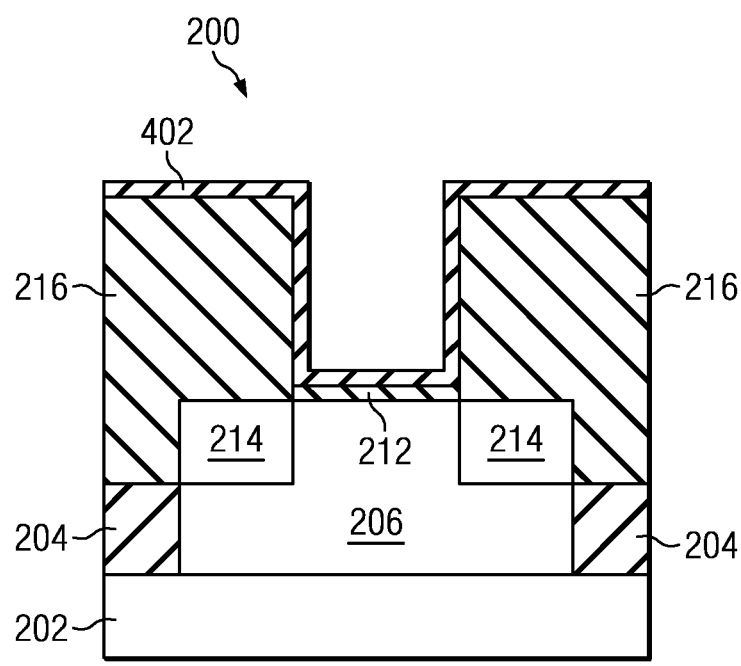
Figure 4B:
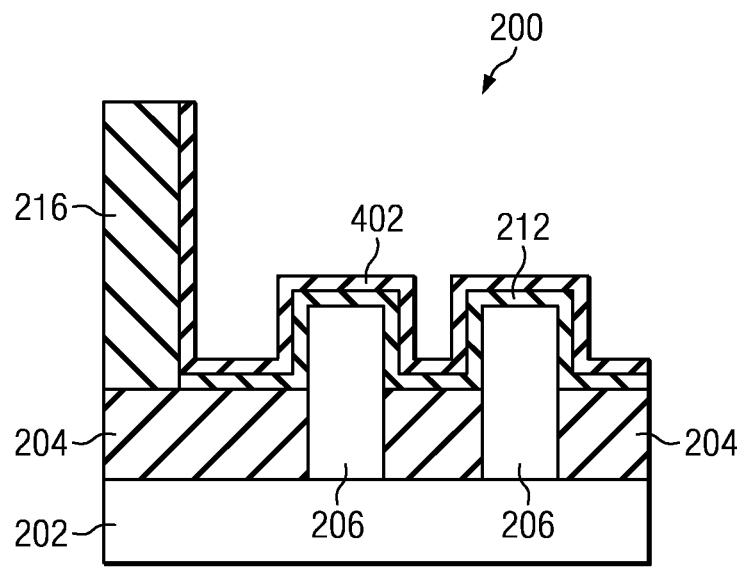

Referring to the example of FIGS. 4a and 4b, a spacer material layer 402 is disposed on the substrate. The spacer material layer 402 may be a conformal layer.

The method 100 then proceeds to block 112 where the spacer material layer is etched to form spacer element(s) on the sidewall(s) of the opening in the dielectric (ILD) layer. The etching process may remove the spacer material layer between fins and on the top surface of the ILD layer. In an embodiment, the etching process has a high selectivity between the spacer material layer and remaining layers on the substrate. The etching process may include a dry or plasma etching process. The spacer material layer may be removed completely from the sidewalls of fins disposed on the substrate.

Figure 5A:
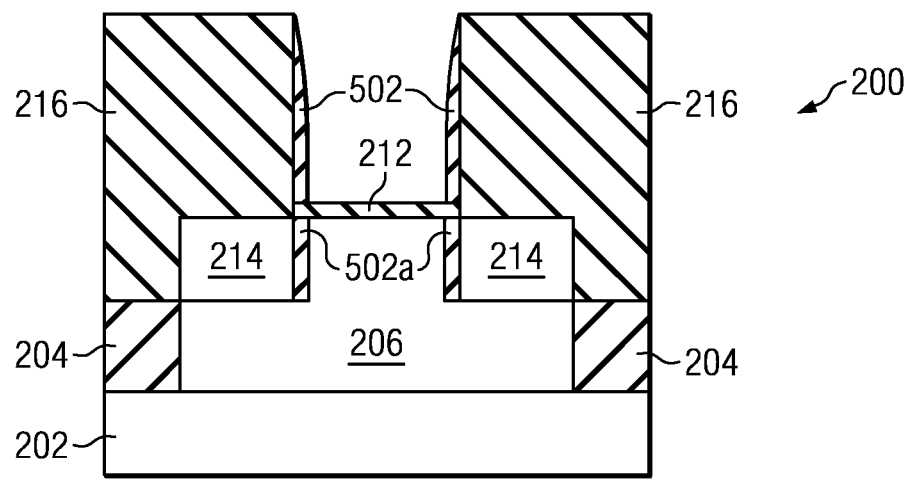
Figure 5B:
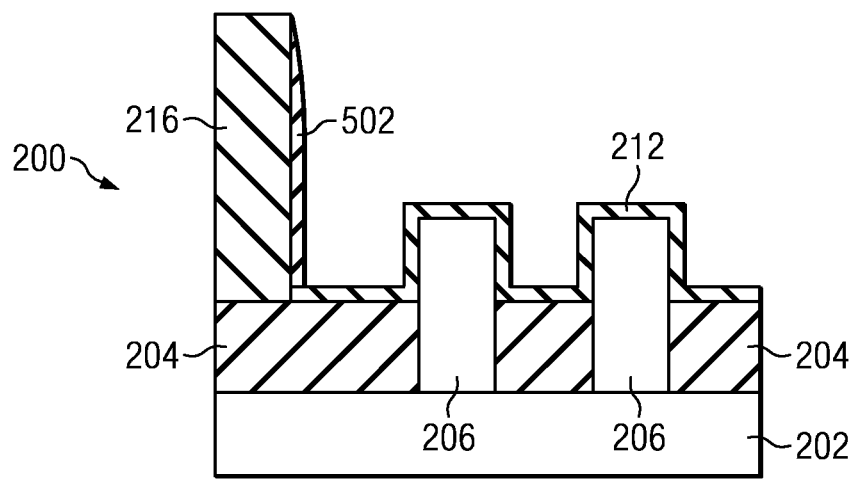
Figure 5C:
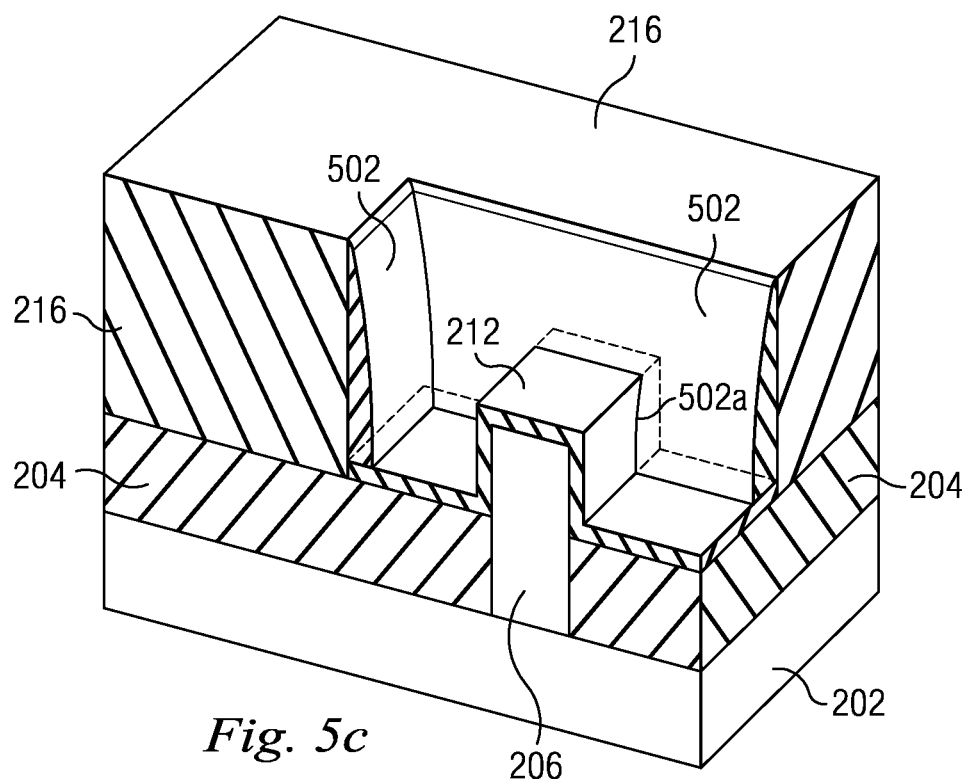
FIG. 5c provides an exemplary perspective view of the device 200.

Referring to the example of FIGS. 5a, 5b, and 5c, the spacer material layer 402 (FIGS. 4a, 4b) has been etched to form spacer elements 502. The spacer elements 502 are formed on the sidewalls of the ILD layer 216. For example, the spacer elements 502 are formed on the sidewalls of the ILD layer 216 defining the opening 302. The spacer elements 502 have a greater width at the bottom (e.g., nearer the substrate) than at the top due to the etching effects (e.g., anisotropic etching processes).

It is noted that portion 502a of the spacer element 502 illustrated in FIG. 5a is not coplanar with the x-cut of the device 200 illustrated in FIG. 5a, but is formed on the ILD layer 216 just offset (e.g., in the z-direction) from cut illustrated in the device 200, as depicted in FIG. 5c.

The method 100 then proceeds to block 114 where the gate dielectric layer is removed. In an embodiment, the block 114 is omitted. The gate dielectric layer may be removed using an etching process (wet etch, dry etch, plasma etch, etc) that is selective to the gate dielectric layer as compared to the spacer elements. The removal of the gate dielectric layer may expose a top surface of the fin(s). It is noted that the gate dielectric layer may remain on the substrate underlying the spacer elements.

Figure 6A:
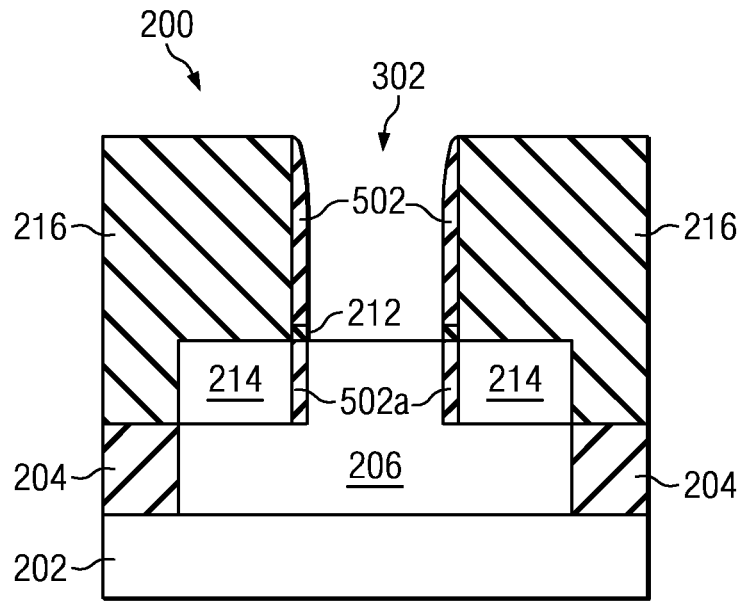
Figure 6B:
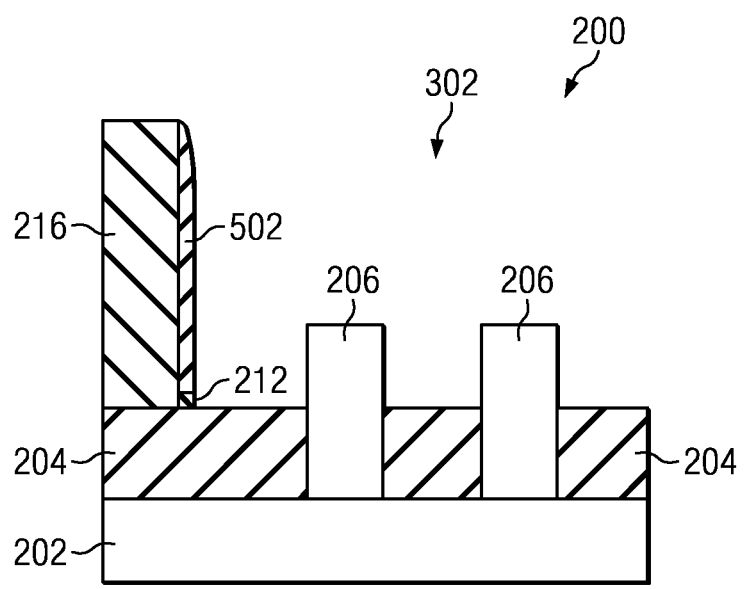

Referring to the example of FIGS. 6a and 6b, the gate dielectric layer 212 is removed from the top surface of the fin. As discussed previously, in other embodiments, the gate dielectric layer 212 may remain on the substrate. For example, the gate dielectric layer 212 may remain on the channel region of the substrate and/or fin and act as the gate dielectric for the gate structure 702, described below.

The method 100 then proceeds to block 116 where a gate structure is formed in the opening provided by the removal of the dummy gate structure. The gate structure may include a metal gate electrode. The metal gate structure may include interfacial layer(s), gate dielectric layer(s), work function layer(s), fill metal layer(s) and/or other suitable materials for a metal gate structure. In other embodiments, the metal gate structure may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric. The gate dielectric layer may include silicon dioxide or other suitable dielectric. In an embodiment, the gate dielectric is a high-k dielectric layer. (As noted above, in alternative embodiments, the method 100 may include a gate dielectric first process where the gate dielectric formed underlying the dummy gate electrode is not removed.) The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods.

Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure. One or more CMP processes may be performed during the formation of the gate structure.

Figure 7A:
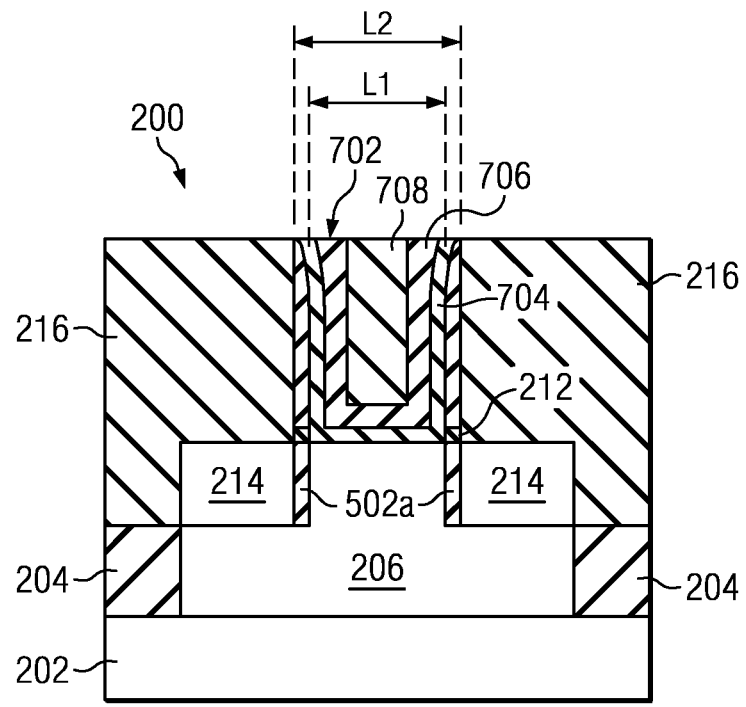
Figure 7B:
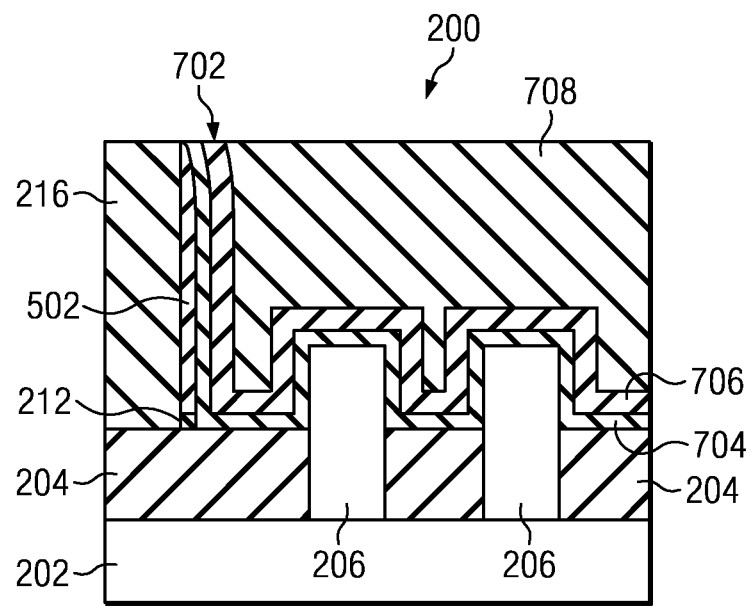

Referring to the example of FIGS. 7a and 7b, a gate structure 702 is formed in the opening 302. The gate structure 702 includes a gate dielectric layer 704, a work function layer 706, and a fill layer 708. However, numerous other layers may be included. The gate structure 702 may include a metal gate electrode and be referred to as a metal gate structure.

It is noted that spacer elements 502 provide an improved profile for the opening 302 in which the gate structure 702 is formed. By providing a tapered sidewall, the gap fill of one or more layers of the gate structure 702 may be improved. This may, for example, reduce the likelihood of voids in the gate structure 702.

It is also noted that gate dimension L1 is decreased as compared to the originally formed opening 302 dimension L2. Thus, in an embodiment, the device 200 and/or the method 100 provide for a methodology and device in which the effective dimensions of a gate structure are reduced. In an embodiment, L1 provides the effective gate length associated with the device 200.

In summary, the methods and devices disclosed herein provide for a semiconductor device and a method of fabricating thereof. In doing so, the present disclosure offers several advantages over prior art devices. Advantages of certain embodiments of the present disclosure include a reduced gate dimension, such as gate length, which may serve to improve the performance of the device. Other advantages of certain embodiments include improved deposition processes of the replacement gate (e.g., metal gate such as gate structure 702) due to an improved profile of the opening in which the replacement gate is formed. It is understood that different embodiments disclosed herein offer different disclosure, and that they may make various changes, substitutions and alterations herein without departing from the spirit and scope of the present disclosure. For example, certain embodiments disclosed herein may illustrate forming a gate structure of a finFET device; however, other embodiments are possible including dimension reduction on planar type devices and methods of fabricating planar-type transistors using replacement gate methodologies. For example, the gate may be formed on a planar region of the substrate that provides the channel region for the device.

In an embodiment, the methods and devices described herein may serve to tune the device performance of one or more transistors on the substrate. In an embodiment, different spacer elements of varying widths may be formed on different devices on a single substrate, thus providing a manner of individually tuning the performance of devices on a substrate or resultant device. For example, different widths of spacer elements may provide different altering of gate dimensions on a single substrate.

Thus, provided is a method of semiconductor fabrication. The method includes forming an inter-layer dielectric (ILD) layer on a semiconductor substrate. The ILD layer has an opening defined by sidewalls of the ILD layer. A spacer element is formed on the sidewall of the ILD layer. A gate structure in the opening adjacent the spacer element. In an embodiment, the sidewall spacer decreases the dimensions (e.g., length) of the opening and thus, decreases the dimensions of the gate structure formed in the opening. Thus, the bottom of the opening (e.g., adjacent the substrate) may be smaller than the opposing top of the opening.

In another embodiment, a semiconductor device is described. The device includes a substrate, an interlayer dielectric (ILD) layer disposed on the substrate, and a gate structure formed in an opening in the ILD layer. The gate structure has a first width at a top portion and a second width at a bottom portion. The first width is greater than the second width. Spacer elements interpose the ILD layer and the gate structure. The spacer elements may account for the decrease in the width of the gate structure. The semiconductor device may be a transistor such as a planar transistor or a finFET device. The semiconductor device may be formed using replacement gate methodology.

In yet another embodiment, a semiconductor device includes a substrate having a plurality of fins extending from the substrate. A dielectric layer is disposed on the substrate adjacent the plurality of fins. A spacer element is disposed on the sidewall of the dielectric layer. A gate structure is disposed over the fins and has an interface with the spacer element. In an embodiment, a second dielectric layer is disposed on the substrate and underlies the spacer element. The second dielectric layer may be a portion of a dummy oxide layer formed as part of dummy gate structure in a replacement gate methodology.

What is claimed is:

1. A method of semiconductor fabrication, comprising:
   providing a semiconductor substrate having a fin extending therefrom;
   forming a dummy gate structure over the fin;
   forming an inter-layer dielectric (ILD) layer on the semiconductor substrate adjacent abutting the dummy gate structure;
   removing the dummy gate structure to form an opening in the ILD layer over the fin;
   wherein the opening is defined by a first sidewall of the ILD layer;
   after forming the ILD layer, forming a spacer element on the first sidewall of the ILD layer; and
   thereafter, forming a gate structure in the opening adjacent the spacer element.

2. The method of claim 1, wherein the forming the spacer element includes depositing a conformal layer of dielectric material, and etching the dielectric material to form the spacer elements on the first sidewall of the ILD layer, wherein the forming the spacer element provides the spacer element extending from a top surface of the ILD layer.

3. The method of claim 2, wherein the etching includes removing the dielectric material from the sidewalls of the fin extending from the semiconductor substrate.

4. The method of claim 2, wherein the dielectric material includes at least one of silicon oxide, silicon nitride, and silicon oxynitride.

5. The method of claim 1, wherein the forming the gate structure includes forming a metal gate electrode.

6. The method of claim 5, wherein the forming the gate structure includes forming a high-k dielectric layer.

7. The method of claim 1, wherein the forming the gate structure includes completely filling the opening adjacent the spacer element providing a top surface of the gate structure substantially coplanar with a top surface of the spacer element.

8. The method of claim 1, wherein the spacer element is formed on a shallow trench isolation structure.

9. The method of claim 1, wherein the forming the gate structure includes forming the gate structure interfacing a plurality of surfaces of a fin extending from the semiconductor substrate.

10. The method of claim 1
    wherein the dummy gate structure including a dummy dielectric layer and a dummy gate electrode; and
    and further comprising: removing a portion of the dummy dielectric layer prior to forming the gate structure, and wherein the forming the spacer element includes forming the spacer element on the dummy dielectric layer.

11. A semiconductor device, comprising:
    a substrate having a fin element extending from the substrate;
    an interlayer dielectric (ILD) layer disposed on the substrate wherein an opening of the ILD layer is defined by a first sidewall and a second sidewall intersecting the first sidewall, the first sidewall and second sidewall being substantially perpendicular to a top surface of the substrate;
    a gate structure formed in the opening in the ILD layer and abutting a plurality of surfaces of the fin element, wherein the gate structure has a first width at a top portion and a second width at a bottom portion, the first width being greater than the second width;
    a first spacer element interposing the ILD layer and the gate structure and extending from a top surface of the ILD layer, wherein the first spacer element is disposed on the first sidewall and extends a first distance into the opening adjacent the top portion of the gate structure and extends a second distance into the opening adjacent the bottom portion of the gate structure, wherein the second distance being greater than the first distance; and
    a second spacer element interposing the ILD layer and the gate structure and extending from the top surface of the ILD layer, wherein the second spacer element is disposed on the second sidewall and extends the first distance into the opening adjacent the top portion of the gate structure and extends the second distance into the opening adjacent the bottom portion of the gate structure, wherein the second distance being greater than the first distance.

12. The semiconductor device of claim 11, wherein the bottom portion of the gate structure interfaces a channel region of the fin.

13. A semiconductor device, comprising:

a plurality of fins extending from a substrate;

a dielectric layer disposed on the substrate adjacent the plurality of fins, wherein the dielectric layer has an opening defined by a first sidewall, an opposing second sidewall, a third sidewall, and an opposing fourth sidewall, the first, second, third and fourth sidewalls being substantially perpendicular to a top surface of the substrate;

a first spacer element disposed on the first-sidewall of the dielectric layer, a second spacer element disposed on the second sidewall of the dielectric layer wherein the first spacer element and the second spacer element are a first distance apart at a top region and a second distance apart at a bottom region, wherein the bottom region is closer to the top surface of the substrate and wherein the second distance is less than the first distance;

a third spacer element disposed on the third sidewall of the dielectric layer, a fourth spacer element disposed on the fourth sidewall of the dielectric layer wherein the third spacer element and the fourth spacer element are a third distance apart at a top region and a fourth distance apart at a bottom region, wherein the bottom region is closer to the top surface of the substrate and wherein the fourth distance is less than the third distance; and a gate structure disposed over the fins and having an interface with the first spacer element, the second spacer element, the third spacer element, and the fourth spacer element such that the gate structure extends the first distance and the third distance at the top portion and the second distance and the fourth distance at the bottom portion.

14. The semiconductor device of claim 13, further comprising:

a second dielectric layer disposed on the substrate and underlying the first spacer element and the second spacer element.

15. The semiconductor device of claim 14, wherein the second dielectric layer is a gate dielectric.

16. The semiconductor device of claim 13, wherein the first spacer element is disposed on a shallow trench isolation structure.

\* \* \* \* \*